US010260753B2

(12) United States Patent
Lego et al.

(10) Patent No.: US 10,260,753 B2
(45) Date of Patent: Apr. 16, 2019

(54) DOMESTIC-APPLIANCE HEATING DEVICE

(71) Applicant: BSH Hausgeräte GmbH, Munich (DE)

(72) Inventors: Dieter Lego, Karlsruhe (DE); Martin Nagel, Forstheim (DE)

(73) Assignee: BSH Hausgeräte GmbH, Munich (DE)

( * ) Notice: Subject to any disclaimer, the term of this patent is extended or adjusted under 35 U.S.C. 154(b) by 0 days.

(21) Appl. No.: 15/767,148

(22) PCT Filed: Oct. 10, 2016

(86) PCT No.: PCT/EP2016/074164
§ 371 (c)(1),
(2) Date: Apr. 10, 2018

(87) PCT Pub. No.: WO2017/071938
PCT Pub. Date: May 4, 2017

(65) Prior Publication Data
US 2018/0299134 A1    Oct. 18, 2018

(30) Foreign Application Priority Data
Oct. 28, 2015   (DE) .................. 10 2015 221 068

(51) Int. Cl.
*H01L 35/00* (2006.01)
*H01L 37/00* (2006.01)
(Continued)

(52) U.S. Cl.
CPC ............ *F24C 7/08* (2013.01); *G01R 19/0038* (2013.01); *G01R 19/0069* (2013.01);
(Continued)

(58) Field of Classification Search
CPC ..... H05B 1/0266; F24C 15/106; H01H 37/10; H01H 37/12; H01H 37/30
(Continued)

(56) References Cited

U.S. PATENT DOCUMENTS

| 7,947,929 B2* | 5/2011 | Oh .................. D06F 58/28 219/481 |
| 8,093,536 B2* | 1/2012 | Kim .................. D06F 58/28 219/497 |

(Continued)

FOREIGN PATENT DOCUMENTS

| DE | 102010031020 A1 | 1/2012 |
| DE | 102012019095 A1 | 3/2014 |

(Continued)

OTHER PUBLICATIONS

International Search Report PCT/EP2016/074164 dated Nov. 30, 2016.
National Search Report DE 10 2015 221 068.5 dated Jun. 15, 2016.

*Primary Examiner* — Anh Q Tra
(74) *Attorney, Agent, or Firm* — Michael E. Tschupp; Andre Pallapies; Brandon G. Braun

(57) ABSTRACT

A domestic appliance heating apparatus includes a heating element having two heating connections connected to two supply connections of a supply network, respectively. A first switching element is connected between one of the two heating connections and one of the two supply connections and a second switching element is connected between the other one of the two heating connections and the other one of the two supply connections. A measuring unit has at least one measuring input, at which a potential is present in at least one heating operating state. A control unit interrupts in a network form recognition operating state a conduction path through the heating element by means of the first switching element while the second switching element is closed and takes into account a first potential present at the measuring input when determining a network form present at the heating element.

21 Claims, 3 Drawing Sheets

(51) Int. Cl.
*H03K 3/42* (2006.01)
*H03K 17/78* (2006.01)
*F24C 7/08* (2006.01)
*G01R 19/00* (2006.01)
*G01R 19/14* (2006.01)
*G01R 31/44* (2006.01)
*G01R 19/165* (2006.01)
*G01R 31/04* (2006.01)

(52) U.S. Cl.
CPC ......... *G01R 19/14* (2013.01); *G01R 19/1659* (2013.01); *G01R 19/16528* (2013.01); *G01R 19/16547* (2013.01); *G01R 19/16576* (2013.01); *G01R 31/045* (2013.01); *G01R 31/44* (2013.01)

(58) Field of Classification Search
USPC .......................................... 327/512; 219/507
See application file for complete search history.

(56) References Cited

U.S. PATENT DOCUMENTS

2013/0119047 A1* 5/2013 Driussi .................. D06F 33/02
219/507
2013/0206750 A1 8/2013 Anton Falcon et al.

FOREIGN PATENT DOCUMENTS

| DE | 102014206279 A1 | 10/2015 |
| EP | 2648476 A1 | 10/2013 |
| EP | 2852249 B1 | 4/2017 |
| WO | 2007009852 A2 | 1/2007 |

\* cited by examiner

DOMESTIC-APPLIANCE HEATING DEVICE

CROSS-REFERENCES TO RELATED APPLICATIONS

This application is the U.S. National Stage of International Application No. PCT/EP2016/074164, filed Oct. 10, 2016, which designated the United States and has been published as International Publication No. WO 2017/071938 A1 and which claims the priority of German Patent Application, Serial No. 10 2015 221 068.5, filed Oct. 28, 2015, pursuant to 35 U.S.C. 119(a)-(d).

BACKGROUND OF THE INVENTION

The invention relates to a domestic appliance heating apparatus according to the preamble of claim 1.

A domestic appliance heating apparatus is already known from the prior art, having a first heating connection and a second heating connection, each being able to be connected to a supply connection of a supply network. A first switching element is connected between the first heating connection and a first supply connection. To start a heating operating state and thus to heat the heating element, a conduction path is established between the heating element and the supply connections by means of the first switching element. To interrupt or terminate the heating operating state, the conduction path between the heating element and the supply connections is interrupted by means of the first switching element. The first switching element is actuated for example by means of an operating element. The domestic appliance heating apparatus also has a measuring unit with a measurement input, at which a potential is present in the heating operating state. In order to allow unambiguous measurement by means of the measuring unit, a network form of the supply network, to which the supply connections are connected, must be known. The network form depends on the country, so different domestic appliance heating apparatuses could be used, in particular could be marketed, depending on the respective country. When the network form is known, in some countries, for example Europe or Japan, the precise polarity of the heating connections must also be ascertained, as in these countries a zero conductor is present at one of the supply connections. This can be done on the one hand using a complex apparatus, which requires at least one phase recognition device, a control unit and a corresponding relay circuit. On the other hand a corresponding polarity of the heating connections could be ascertained when an electrician and/or fitter in particular connects the heating connections to the supply connections.

BRIEF SUMMARY OF THE INVENTION

The object of the invention is in particular to provide an apparatus of the type in question having improved properties in respect of little complexity when determining a network form present at heating connections. The object is achieved by the features of claim 1, while advantageous configurations and developments of the invention can be drawn from the subclaims.

The invention relates to a domestic appliance heating apparatus, in particular a cooking appliance heating apparatus, with at least one heating element, which has at least two heating connections, which are each provided for connection to one of at least two supply connections of a supply network, in particular a domestic network, with at least one first switching element, which is connected between a first heating connection of the heating connections and a first supply connection of the supply connections, with at least one second switching element, which is connected between a second heating connection of the heating connections and a second supply connection of the supply connections, and with a measuring unit, which has at least one measuring input, at which a potential is present in at least one heating operating state.

It is proposed that the domestic appliance heating apparatus has a control unit, which is provided to interrupt a conduction path through the heating element by means of the first switching element with the second switching element closed in at least one network form recognition operating state, and to take into account a first potential present at the measuring input when determining a network form present at the heating element. A "domestic appliance heating apparatus" refers in particular to at least a part, in particular a subassembly, of a domestic appliance, in particular of a cooking appliance, advantageously of an oven. The domestic appliance heating apparatus can in particular also comprise the entire domestic appliance, in particular the entire cooking appliance. A "heating element" refers in particular to an element, which is provided to heat preferably in an inductive manner in the at least one heating operating state, in particular with a heating output of at least 100 W, in particular at least 500 W, preferably at least 1000 W, particularly advantageously at least 1500 W and preferably at least 3000 W. A "connection" of an object refers in particular to an electrical contact point, by way of which the object can be connected electrically to a further object, and at which an electric potential is advantageously present in at least one operating state, in particular in the heating operating state. A "switching element" refers in particular to an element, which is provided to establish and/or break an electrically conducting connection between at least two points, in particular between at least two contacts of the switching element. The switching element is configured in particular as an electrical element and preferably has at least one control contact for receiving a control signal, the switching element being able to be actuated by way of the control contact and being able to be connected in particular between the contacts, in particular as a function of a control signal generated by the control unit. The expression that the switching element is connected "between" two connections means in particular that a conduction path connecting the connections to one another passes by way of the switching element, it being possible for the conduction path to carry electric current in particular solely with the switching element in a closed switching position. A "conduction path" refers in particular to an electrically conductive connection, which is provided to carry an electric current in at least one operating state, in particular in the heating operating state. A "measuring unit" refers in particular to a unit, which is provided to detect a value of a potential present at the measuring input in the heating operating state and which in particular has at least one measuring output to output the detected value of the potential present at the measuring input advantageously to the control unit. A "measuring input" of the measuring unit refers in particular to a connection of the measuring unit at which an electric potential to be detected is present at least in the heating operating state. A "heating operating state" refers in particular to an operating state in which electric current flows through the heating element, in particular to output electric power. A "control unit" refers in particular to an electronic unit, which is at least partially integrated preferably in a control and/or regulating unit of a domestic appliance, in particular of a cooking appliance, and which is preferably provided to control and/or regulate at least the heating element and/or the first switching element and/or the second switching element. The control unit preferably comprises a computation unit and in particular in addition to the computation unit a storage unit with a control and/or regulating program stored therein, which is provided to be executed by the computation unit. A "network form recognition operating state" refers in particular to an operating state in which a network form present at the heating connections of the heating element can be detected. In particular the control unit is provided advantageously to deactivate the heating element by opening the first switching element with the second switching element closed in the network form recognition operating state, with a heating output output by the heating element in particular having a value of at least essentially zero. The second switching element is advantageously configured as a main switch. In particular the control unit is provided to move the first switching element to an opened switching position and the second switching element to a closed switching position in the network form recognition operating state, with the result that a first electric potential is present in particular at the measuring input, which the control unit takes into account when determining the network form present at the heating element. In particular the control unit is provided to store the first potential in the storage unit of the control unit in the network form recognition operating state. Alternatively or additionally the control unit could be provided to move the second switching element to an opened switching position and the first switching element to a closed switching position in the network form recognition operating state, with the result that a first electric potential could be present in particular at the measuring input, which the control unit could take into account when determining the network form present at the heating element. The network form defines and/or characterizes in particular a sort of low voltage network and/or a type of low voltage network. For example a network form could define a three-phase alternating current. In the case of a three-phase alternating current the network form could in particular define a voltage with a value of at least essentially 400 V and/or at least essentially 415 V and/or at least essentially 200 V and/or at least essentially 380 V. Alternatively or additionally a network form could in particular define a TN system and/or a TT system and/or an IT system. In particular the network form could alternatively or additionally define a single-phase alternating current. In the case of a single-phase alternating current the network form could in particular define a voltage with a value of at least essentially 230 V and/or at least essentially 240 V and/or at least essentially 200 V and/or at least essentially 220 V. The network form could in particular define different low voltage networks in different countries. In particular the network form could change depending on the country. "Provided" means in particular specifically programmed, designed and/or equipped. That an object is provided for a specific function means in particular that the object satisfies and/or performs said specific function in at least one application and/or operating state.

Such a configuration in particular allows a low level of complexity when determining a network form present at the heating connections. This preferably allows costs to be reduced. The domestic appliance heating apparatus can particularly advantageously be connected without hesitation to a respective supply network in different countries. Furthermore, assembly and/or production can be completed quickly, both when manufacturing the domestic appliance heating apparatus and when an end user connects the domestic appliance heating apparatus, this being possible in particular without the assistance of an electrician and/or fitter. This is also very convenient for the end user. It also advantageously allows simple and uncomplicated connection and therefore in particular makes maintenance very simple. In particular a network form can be determined economically by a software algorithm, there being no need in particular for additional hardware. The domestic appliance heating apparatus and/or a domestic appliance having the domestic appliance heating apparatus can in particular be used worldwide, there being no need in particular for specific adaptation in respect of wiring and/or electronics and/or software due to different network forms.

It is further proposed that the control unit is provided to interrupt a conduction path through the heating element by means of the second switching element with the first switching element closed in the network form recognition operating state and to take into account a second potential present at the measuring input when determining the network form present at the heating element. In particular the control unit is provided to store the second potential in the storage unit of the control unit in the network form recognition operating state. Alternatively or additionally the control unit could be provided to interrupt a conduction path through the heating element by means of the first switching element with the second switching element closed in the network form recognition operating state and to take into account a first potential present at the measuring input when determining the network form present at the heating element. The control unit is particularly advantageously provided to interrupt a conduction path through the heating element first by means of any one of the switching elements with the further switching element closed and then by means of the further switching element with the any one switching element closed in the network form recognition operating state and to take into account both potentials present at the measuring input when determining the network form present at the heating element. The control unit is provided in particular to compare in particular the first potential and the second potential with one another in the network form recognition operating state and advantageously to calculate a difference between the first potential and the second potential. In particular the control unit is provided to determine an amount of the difference between the first potential and the second potential in the network form recognition operating state and in particular to compare the amount of the difference between the first potential and the second potential with a difference reference potential stored in the storage unit of the control unit. This allows the network form to be determined in particular in a simple manner. In particular the potentials present at the heating connections can be processed separately and/or be differentiated from one another. Any sort of network form can be recognized particularly advantageously from two measurements.

It is also proposed that the control unit is provided to recognize a presence of a zero conductor at one of the supply connections from the potentials present at the measuring input in the network form recognition operating state. The control unit is provided in particular to conclude a presence of a zero conductor at one of the supply connections in the network form recognition operating state if the amount of the difference between the first potential and the second potential is greater than the difference reference potential stored in the storage unit of the control unit. This allows differentiation between different network forms in particular by means of simple software operations.

It is further proposed that the control unit is provided, in particular in the event of a presence of a zero conductor at one of the supply connections, to determine the supply connection at which the zero conductor is present, in particular from the potentials present at the measuring input, in at least one polarity detection operating state. In the event of a presence of a zero conductor at one of the supply connections, the control unit is provided in particular to compare the first potential with a lower reference potential stored in the storage unit of the control unit in the polarity detection operating state. In particular the control unit is provided to recognize a presence of a zero conductor at the first heating connection and in particular also a presence of a phase conductor at the second heating connection in the polarity detection operating state if the first potential is smaller than the lower reference potential. The control unit is provided in particular to compare the first potential with an upper reference potential stored in the storage unit of the control unit in the polarity detection operating state. In particular the control unit is provided to recognize a presence of a zero conductor at the second heating connection and in particular also a presence of a phase conductor at the first heating connection in the polarity detection operating state if the first potential is greater than the upper reference potential. Alternatively or additionally the control unit is provided in particular to compare the second potential with a lower reference potential stored in the storage unit of the control unit in the event of a presence of a zero conductor at one of the supply connections in the polarity detection operating state. In particular the control unit is provided to recognize a presence of a zero conductor at the second heating connection and in particular also a presence of a phase conductor at the first heating connection in the polarity detection operating state if the second potential is smaller than the lower reference potential. The control unit is provided in particular to compare the second potential with an upper reference potential stored in the storage unit of the control unit in the polarity detection operating state. In particular the control unit is provided to recognize a presence of a zero conductor at the first heating connection and in particular also a presence of a phase conductor at the second heating connection in the polarity detection operating state if the second potential is greater than the upper reference potential. A "polarity detection operating state" refers in particular to an operating state, in which a polarity direction present at the heating connections of the heating element can be detected.

In particular the control unit is provided advantageously to deactivate the heating element by opening the first switching element with the second switching element closed in the polarity detection operating state, with a heating output output by the heating element in particular having a value of at least essentially zero. Alternatively or additionally the control unit is provided in particular advantageously to deactivate the heating element by opening the second switching element with the first switching element closed in the polarity detection operating state, with a heating output output by the heating element in particular having a value of at least essentially zero. This in particular allows operation of the domestic appliance and/or in particular timely recognition of overheating of the heating element independently of an insertion direction of an appliance plug in a socket of the supply network.

The control unit is provided in particular to conclude an absence of a zero conductor at one of the supply connections and in particular a presence of phase conductors in the network form recognition operating state if the amount of the difference between the first potential and the second potential is smaller than the difference reference potential stored in the storage unit of the control unit. The control unit is preferably provided to recognize a presence of phase conductors at the supply connections from the potentials present at the measuring input in the network form recognition operating state. In particular the control unit is provided to verify the validity of the first potential and/or, in particular and, the second potential, in particular for use when recognizing a presence of phase conductors at the supply connections, in the network form recognition operating state. The control unit is provided in particular to compare the first potential and/or, in particular and, the second potential with a validity range stored in the storage unit of the control unit in the network form recognition operating state and to conclude a presence of phase conductors at the supply connections in particular if the first potential and/or, in particular and, the second potential is/are within the validity range. This is very convenient in particular for an operator and/or allows a presence of phase conductors at the supply connections to be recognized in a simple manner.

The control unit is provided in particular to dispense with the use of the first potential and/or, in particular and, the second potential when recognizing a presence of phase conductors at the supply connections in the network form recognition operating state, in particular if the first potential and/or, in particular and, the second potential is/are outside the validity range. The control unit is preferably provided to recognize at least one appliance defect from the potentials present at the measuring input in the network form recognition operating state, in particular if the first potential and/or, in particular and, the second potential is/are outside the validity range. This provides a high level of reliability in particular for an operator.

It is further proposed that the control unit is provided to determine a trip limit value for the heating element from the determined network form in the network form recognition operating state. In particular at least two, advantageously at least three, particularly advantageously at least four and preferably a number of different trip limit values for the heating element are stored in the storage unit of the control unit. In particular a respective trip limit value is assigned to a network form. The control unit is provided in particular to determine a trip limit value assigned to the determined network form in the network form recognition operating state and in particular to take into account the determined trip limit value for the heating element in the heating operating state. This protects the heating element from overheating in particular independently of a network form present at the heating connections, in particular ensuring that the configuration has a long service life.

It is further proposed that the domestic appliance heating apparatus has at least one sensor element, which is provided to detect a leakage current from the heating element in the heating operating state. A "sensor element" refers in particular to an element, which is provided to record an electric current, in particular a leakage current, leaving the heating element in the heating operating state and advantageously to forward it to at least one further unit, in particular to the measuring unit. A "leakage current" from the heating element refers in particular to an electric current, which differs in particular from an electric current leaving the heating element by way of one of the heating connections and which leaves the heating element by way of at least one path, which is different in particular from an electrical connection between one of the heating connections and one of the supply connections and is advantageously a high-resistance conduction path in at least one operating state, in particular with resistance values in a range from several to a number of MΩ. This allows in particular precise detection of the leakage current and/or timely error recognition. Detection of the leakage current also allows in particular a temperature of the heating element to be determined.

For example the control unit could be provided to perform an emergency trip immediately on detection of a leakage current from the heating element by deactivating the heating element, in particular by means of the first switching element and/or advantageously by means of the second switching element. The control unit is preferably provided to determine at least one characteristic variable that is a function of the leakage current from the heating element in the heating operating state. For example the characteristic variable could comprise a value of the leakage current. It is also conceivable for the characteristic variable to comprise a position where the leakage current leaves the heating element. The characteristic variable preferably comprises a temperature of the heating element. This advantageously ensures a high level of reliability in the heating operating state. It also particularly advantageously allows overheating of the heating element to be recognized in a timely manner and in particular counter measures to be instituted.

It is further proposed that at least two parallel conduction paths lead from one of the supply connections to the measuring input in the heating operating state, a first conduction path of the conduction paths comprising a region between the heating element and the sensor element, through which the leakage current flows. This allows in particular a polarity of the heating element to be determined independently of a heating operating state, allowing a high level of precision to be achieved.

If the control unit is provided to take into account the network form present at the heating element when determining the characteristic variables that are a function of the leakage current from the heating element in the heating operating state, precise determination of the characteristic variables that are a function of the leakage current from the heating element, in particular the temperature of the heating element, can be achieved.

For example the heating element could be configured in particular as a coiled conductor, advantageously as a coiled wire. The heating element is preferably configured as a layer. A "layer" refers in particular to a configuration of an object, in which a smallest cuboid still enclosing the object has one shortest side and two long sides, a shorter side of the two long sides being at least 5 times, in particular at least 10 times, advantageously at least 15 times and particularly advantageously at least 20 times the size of the shortest side of the cuboid. The layer in particular has at least essentially the same material thickness, which advantageously has a value of maximum 5 mm, in particular maximum 1 mm, advantageously maximum 0.5 mm and particularly advantageously maximum 0.1 mm. The expression that the layer has "at least essentially the same material thickness", means in particular that an amount of the material thickness in the region of the layer changes by maximum 20%, in particular maximum 10% and advantageously maximum 5%. The heating element can be configured in particular as an induction heating element. The heating element is preferably configured as a radiation heating element and/or particularly advantageously as a resistance heating element. This in particular allows a compact structure to be achieved. Costs can also be kept low.

For example the sensor element could be configured in particular as a coiled conductor, advantageously as a coiled wire. The sensor element is preferably configured as a layer, which in particular results in a space-saving configuration.

The heating element and sensor element together advantageously form a capacitor, allowing precise detection of the leakage current from the heating element. In particular when the heating element and sensor element are configured as a layer both together preferably form a plate capacitor.

It is also proposed that the domestic appliance heating apparatus has at least one dielectric, which is arranged at least partially between the heating element and the sensor element and has a temperature-dependent specific resistance, the control unit being provided to use the temperature-dependent specific resistance of the dielectric to determine the characteristic variable. The temperature-dependent specific resistance of the dielectric only changes slightly in particular below a threshold value, in particular of at least essentially 200° C., and/or at least essentially 300° C., in particular by maximum 5%, advantageously maximum 1%, particularly advantageously maximum 0.5% and preferably maximum 0.1% of an amount of the specific resistance at a temperature of zero degrees Celsius. At temperatures above the threshold value a resistance value of the temperature-dependent specific resistance of the dielectric decreases significantly, the resistance value of the dielectric at temperatures above the threshold value in particular having a resistance value of maximum 70%, advantageously maximum 50%, particularly advantageously maximum 30% and preferably maximum 10% of a resistance value at temperatures below the threshold value and the value of the temperature-dependent specific resistance being able to have for example a linear and/or exponential profile. The expression that the control unit is provided to "use" the temperature-dependent specific resistance of the dielectric to determine the characteristic variable means in particular that the control unit is provided to determine a leakage current from the heating element from knowledge of a potential present at the measuring input in the heating operating state and in particular to draw conclusions about a current resistance value of the dielectric from the determined leakage current from the heating element and advantageously to determine the characteristic variable from knowledge of the profile of the temperature-dependent specific resistance of the dielectric stored in the storage unit. This in particular allows exact determination of the characteristic variable. It also advantageously allows an economical configuration to be achieved.

A particularly low level of complexity can be achieved when determining a network form present at the heating connections by a domestic appliance, in particular by a cooking appliance, with at least one inventive domestic appliance heating apparatus.

Complexity when determining a network form present at the heating connections can be further reduced by a method for operating an inventive domestic appliance heating apparatus with a least one heating element, which has at least two heating connections, which are each provided for connection to one of at least two supply connections of a supply network, with at least one first switching element, which is connected between a first heating connection of the heating connections and a first supply connection of the supply connections, with at least one second switching element, which is connected between a second heating connection of the heating connections and a second supply connection of the supply connections, and with a measuring unit, which has at least one measuring input, at which a potential is present in at least one heating operating state, a conduction path through the heating element being interrupted by means of the first switching element with the second switching element closed in at least one network form recognition operating state and a first potential present at the measuring input being taken into account when determining a network form present at the heating element.

The domestic appliance heating apparatus here should not be restricted to the application and embodiment described above. In particular the domestic appliance heating apparatus can have a number of individual elements, components and units that is different from a number cited herein to achieve a mode of operation described herein.

Further advantages will emerge from the description of the drawing which follows. The drawing shows an exemplary embodiment of the invention. The drawing, description and claims contain numerous features in combination. The person skilled in the art will expediently also consider the features individually and being them together in further useful combinations.

DETAILED DESCRIPTION OF EXEMPLARY EMBODIMENTS OF THE PRESENT INVENTION

Figure 1:
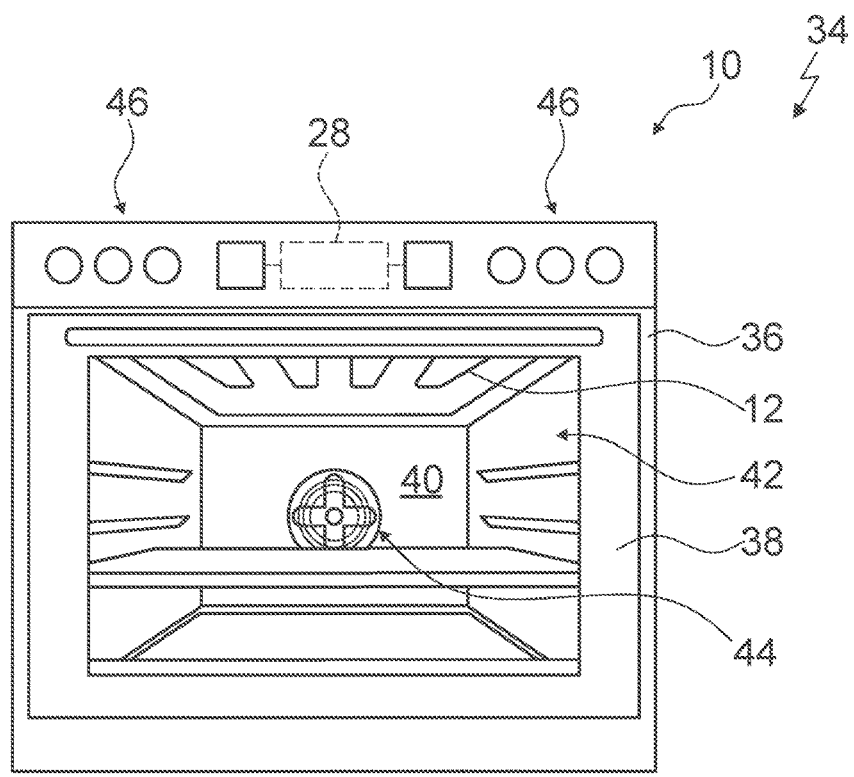
FIG. 1 shows a schematic perspective view of a domestic appliance with a domestic appliance heating apparatus.

FIG. 1 shows a domestic appliance 34, which is configured as a cooking appliance, with a domestic appliance heating apparatus 10, which is configured as a cooking appliance heating apparatus. For example the domestic appliance 34 could be configured as a steam cooker and/or as an induction oven and/or as a cooker and/or as a kettle and/or as a coffee machine and/or as a toaster and/or as a teppanyaki griddle. In the present instance the domestic appliance 34 is configured as an oven.

The domestic appliance 34 has a housing 36, which forms an outer delimitation in particular of the domestic appliance 34. On a front face of the housing 36 facing an operator when the appliance is built in, the housing 36 has an appliance door 38. The appliance door 38 allows access to a cooking chamber 40 present in the housing 36. The domestic appliance 34 has a muffle 42, which delimits the cooking chamber 40. The muffle 42 forms a lateral delimitation of the cooking chamber 40. To ventilate the cooking chamber 40, the domestic appliance 34 has a fan 44, which is arranged on a rear face facing away from the appliance door 38.

To heat the cooking chamber 40, the domestic appliance heating apparatus 10 has a heating element 12. As an alternative to a configuration with a single heating element the domestic appliance heating apparatus could also comprise a different number of heating elements. For example the domestic appliance heating apparatus could have two heating elements. The heating elements here could be arranged on an upper face and a lower face of the muffle. Alternatively both heating elements could be arranged on the same face of the muffle. A first heating element of the heating elements could be arranged on the upper face and could be configured to generate top heat. A second heating element of the heating elements could be arranged on the lower face and could be configured to generate bottom heat. Alternatively or additionally heating elements arranged at the side of the muffle, in particular on side walls of the muffle, could be provided. The heating element could be configured as an induction heating element and/or as a radiation heating element for example. In the present exemplary embodiment the heating element 12 is configured as a resistance heating element.

The domestic appliance heating apparatus 10 has an operating unit 46 (see FIG. 1) for inputting and/or selecting operating parameters. The operating parameter could comprise for example a cooking time and/or a cooking program and/or a heating output stage. In particular an operating parameter is a temperature, advantageously a target temperature, the operating unit 46 being provided to input and/or change a value of a target temperature of the cooking chamber 40. The operating unit 46 is arranged on the front face. The operating unit 46 in particular has a display unit and is advantageously provided to output a value.

The domestic appliance heating apparatus 10 has a control unit 28, which performs actions and/or sets and/or changes settings as a function of the operating parameters input and/or selected by means of the operating unit 46. The control unit 28 is provided to control and regulate the heating element 12. The domestic appliance heating apparatus 10 has a sensor (not shown), which is provided to detect an actual temperature of the cooking chamber 40. Alternatively, it is conceivable for the domestic appliance heating apparatus to have a number of sensors.

Figure 3:
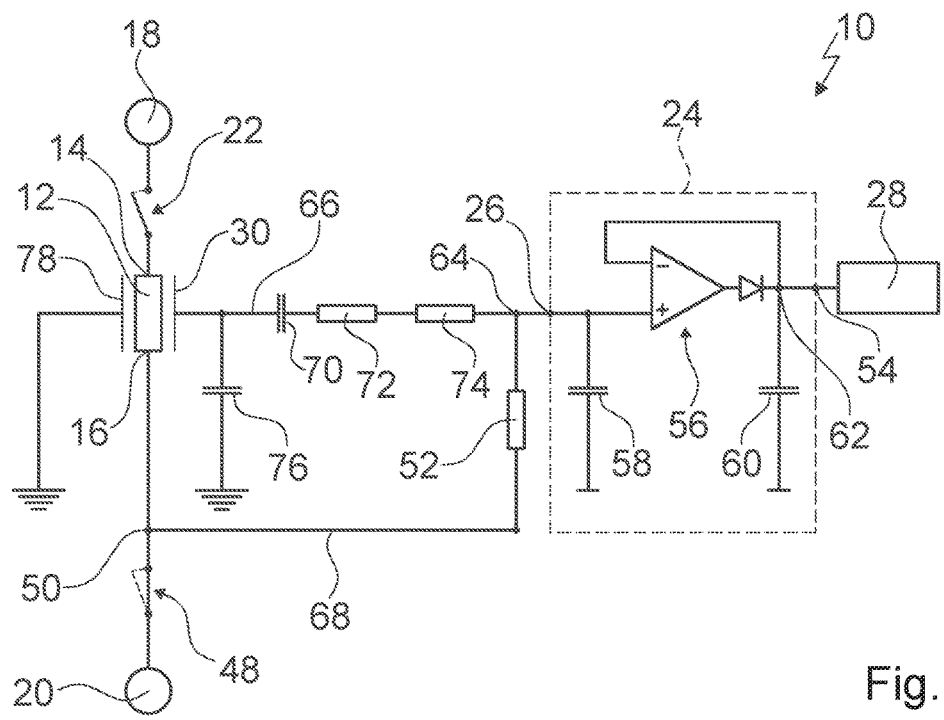
FIG. 3 shows a schematic circuit diagram of the domestic appliance heating apparatus in a network form recognition operating state, shown schematically.
Figure 4:
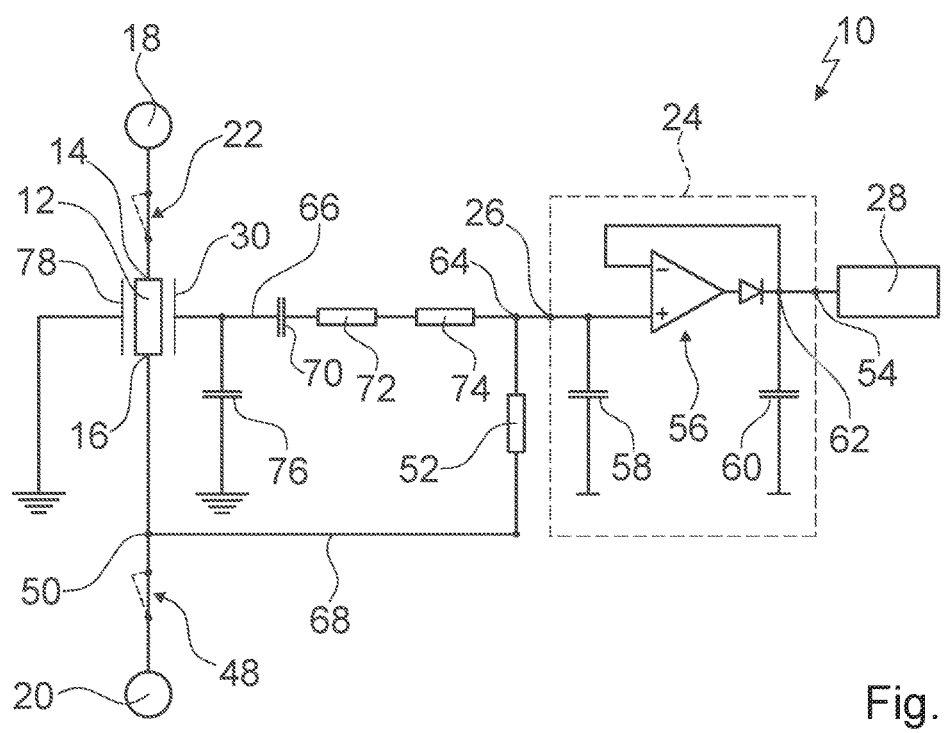
FIG. 4 shows a schematic circuit diagram of the domestic appliance heating apparatus in a heating operating state, shown schematically

To supply the heating element 12 with energy, the heating element 12 has two heating connections 14, 16 (see FIGS. 3 and 4). Each of the heating connections 14, 16 is provided for connection to a supply connection 18, 20 of a supply network. Alternatively the domestic appliance heating apparatus could have a power supply, which is provided to supply the heating element with energy. The power supply could be a converter circuit, in particular with at least one rectifier and/or inverter. The power supply could also have a connection to a supply network, in particular a power supply network.

A first heating connection 14 of the heating connections 14, 16 and a first supply connection 18 of the supply connections 18, 20 are connected electrically to one another. A second heating connection 16 of the heating connections 14, 16 and a second supply connection 20 of the supply connections 18, 20 are connected electrically to one another. The domestic appliance heating apparatus 10 has a first switching element 22 and a second switching element 48. The first switching element 22 is connected between the first heating connection 14 of the heating connections 14, 16 and the first supply connection 18 of the supply connections 18, 20. A first connection of the first switching element 22 and the first supply connection 18 are connected electrically to one another. A second connection of the first switching element 22 and the first heating connection 14 are connected electrically to one another.

The second switching element 48 is connected between the second heating connection 16 and the second supply connection 20. A first connection of the second switching element 48 and the second heating connection 16 are connected electrically to one another. A second connection of the second switching element 48 and the second supply connection 20 are connected electrically to one another. The second switching element 48 is a main switch of the domestic appliance 34. Each switching element 22, 48 has a relay. Alternatively at least one of the switching elements could comprise a power semiconductor switch for example.

The domestic appliance heating apparatus 10 has a measuring unit 24, which has a measuring input 26. A potential is present at the measuring input 26 at least in a heating operating state. The measuring input 26 and the second heating connection 16 are connected electrically to one another. The measuring input 26 and the first connection of the second switching element 48 are connected electrically to one another. The measuring input 26 branches from the electrical connection between the second heating connection 16 and the first connection of the second switching element 48 at a connection point 50. An electrical resistance 52 is connected between the measuring input 26 and the connection point 50. The resistance 52 has a resistance value of essentially 10 kΩ.

The measuring unit 24 has a measuring output 54. A first connection of the control unit 28 and the measuring output 54 are connected electrically to one another. The measuring unit 24 outputs a peak value of a potential present at the measuring input 26 by way of the measuring output 54. The measuring unit 24 has a rectifier 56. The rectifier 56 has a rectifier input, which is connected electrically to the measuring input 26. A measuring capacitor 58 branches from an electrical connection between the measuring input 26 and the rectifier 56. The measuring capacitor 58 has a capacitance of essentially 100 nF. The measuring unit 54 comprises the measuring capacitor 58, which is provided to filter out a high-frequency component. A first connection of the first measuring capacitor 58 is connected electrically to the connection between the measuring input 26 and the rectifier 56. A second connection of the first measuring capacitor 58 is connected electrically to ground. The rectifier 56 is formed by an operation amplifier with downstream diode. Alternatively the rectifier 56 could be formed by a bridge rectifier.

The measuring unit 24 has a further measuring capacitor 60, which is provided to smooth a voltage output by the rectifier 56. The measuring capacitor 60 has a capacitance of essentially 10 nF. The further measuring capacitor 60 branches from a connection between the rectifier 56 and the measuring output 54 at a measuring connection point 62. A first connection of the further measuring capacitor 60 and the measuring connection point 62 are connected electrically to one another. The rectifier 56 has a further rectifier input, which is connected electrically to the measuring connection point 62. A second connection of the further measuring capacitor 60 is connected electrically to ground.

If there is a potential present at the measuring input 26, as is the case for example in the heating operating state, the further measuring capacitor 60 is charged by way of the rectifier 56. As the first connection of the further measuring capacitor 60 is connected to the further rectifier input by way of the measuring connection point 62, the further measuring capacitor 60 is charged to a voltage value, which corresponds to a value of the potential present at the measuring input 26. This value is then output to the control unit 28 by way of the measuring output 54. Thus in a method for operating the domestic appliance heating apparatus 10 a potential present at the measuring input 26 can be determined by the control unit 28 in the heating operating state.

The potential present at the measuring input 26 is variable in the heating operating state and changes as a function of a function of the heating element 12.

Figure 2:
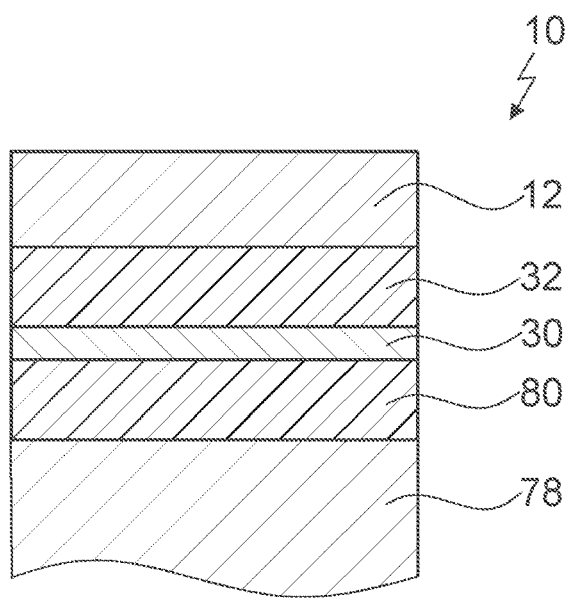
FIG. 2 shows a schematic sectional view of a heating element, a dielectric, a sensor element, a further dielectric and a base element of the domestic appliance heating apparatus.

To monitor a function of the heating element 12 in the heating operating state, the domestic appliance heating apparatus 10 has a sensor element 30 (see FIG. 2). The sensor element 30 is provided to detect a leakage current from the heating element 12 in the heating operating state. A leakage current from the heating element 12 is undesirable even though it always occurs when the heating element 12 is heated. The leakage current from the heating element 12 is negligibly small at temperatures below a threshold value. At temperatures above the threshold value the leakage current increases significantly, indicating a malfunction of the heating element 12. The sensor element 30 and the measuring input 26 are connected electrically to one another. An electrical connection between the sensor element 30 and the measuring input 26 and an electrical connection between the connection point 50 and the measuring input 26 have a common contact point 64.

Two parallel conduction paths 66, 68 lead from one of the supply connections 18, 20 to the measuring input 26 at least in the heating operating state. A first conduction path 66 of the conduction paths 66, 68 leads from one of the supply connections 18, 20 by way of the heating element 12 and the sensor element 30 to the measuring input 26. The first conduction path 66 of the conduction paths 66, 68 comprises a region between the heating element 12 and the sensor element 30, through which the leakage current flows. A second conduction path 68 of the conduction paths 66, 68 leads from one of the supply connections 18, 20 by way of the connection point 50 and the electrical resistance 52 to the measuring input 26. The electrical resistance 52 present in the second conduction path 68 is connected between the connection point 50 and the contact point 64.

Connected in series between the sensor element 30 and the contact point 64 are a capacitance and an ohmic resistance, in particular a capacitor 70, a first resistance 72 and a second resistance 74. The capacitor 70 has a capacitance of essentially 100 nF. The first resistance 72 has a resistance value in a range from 30 kΩ to 50 kΩ, in particular of essentially 33 kΩ. The second resistance 74 has a resistance value in a range from 30 kΩ to 50 kΩ, in particular of essentially 33 kΩ. The sensor element 30 and a first connection of the capacitor 70 are connected electrically to one another. A capacitor 76 branches from the connection between the sensor element 30 and the first connection of the capacitor 70. A first connection of the capacitor 76 and the connection between the sensor element 30 and the first connection of the capacitor 70 are connected electrically to one another. A second connection of the capacitor 76 is connected electrically to ground. The series circuit of the capacitor 70, the first resistance 72 and the second resistance 74 has a specific resistance with a value which is essentially ten times the size of a value of the electrical resistance 52 present in the second conduction path 68.

If one of the switching elements 22, 48 is closed and another of the switching elements 22, 48 is opened, a potential with a value that is a function of a network form present at the heating element 12 is present at the measuring input 26. Different network forms are present at the heating element 12, depending on the country in which the domestic appliance 34 is used. As the potential present at the measuring input 26 changes as a function of a network form present at the heating element 12, the network form present at the heating element 12 should be known for an exact detection of the leakage current from the heating element 12 in the heating operating state.

The following incomplete table shows some examples of network forms for different countries:

| Country | Three-phase alternating current | Single-phase alternating current |
| --- | --- | --- |
| Germany | 400 V | 230 V |
| Switzerland | 400 V | 230 V |
| Great Britain | 415 V | 240 V |
| Australia | 415 V | 240 V |
| Japan | 200 V | 100 V |
| Philippines | 380 V | 220 V |

Figure 5:
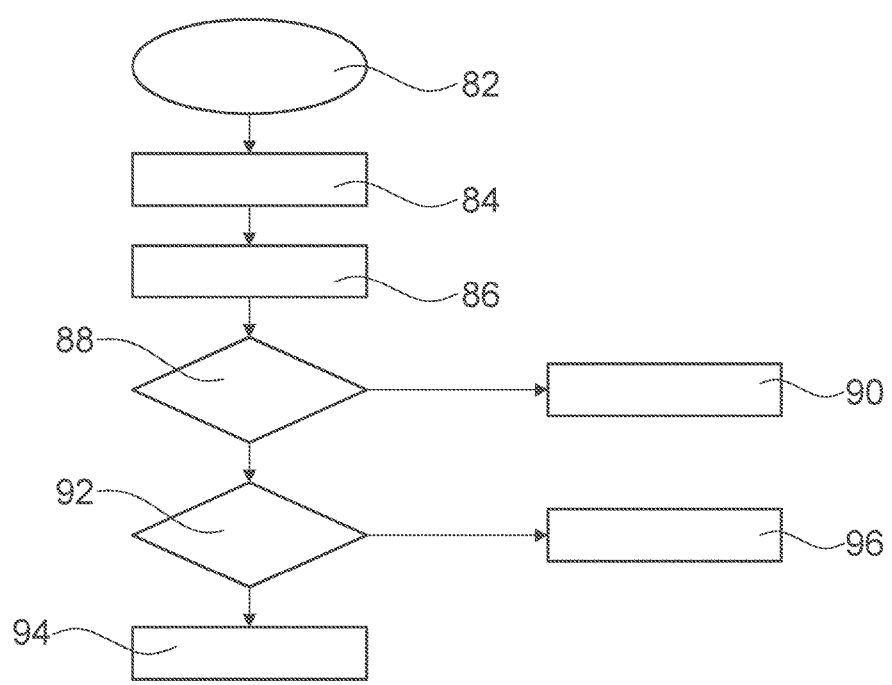
FIG. 5 shows a schematic diagram of a method for operating the domestic appliance heating apparatus.

In a method for operating the domestic appliance heating apparatus 10, in particular when the domestic appliance 34 is first activated, in a first method step 82 a network form recognition operating state is started (see FIG. 5). The control unit 28 starts the network form recognition operating state automatically. In the network form recognition operating state in a first measuring step 84 the control unit 28 interrupts a conduction path through the heating element 12 by means of the first switching element 22 with the second switching element 48 closed. In the first measuring step 84 a first potential is present at the measuring input 26. In the network form recognition operating state the control unit 28 takes into account the first potential present at the measuring input 26 when determining a network form present at the heating element 12. The control unit 28 stores the first potential in a storage unit of the control unit 28 in the network form recognition operating state.

In a second measuring step 86 in the network form recognition operating state the control unit 28 interrupts a conduction path through the heating element 12 by means of the second switching element 48 with the first switching element 22 closed. In the second measuring step 86 a second potential is present at the measuring input 26. In the network form recognition operating state the control unit 28 takes into account the second potential present at the measuring input 26 when determining a network form present at the heating element 12. The control unit 28 stores the second potential in the storage unit of the control unit 28 in the network form recognition operating state.

In the network form recognition operating state in a first verification step 88 the control unit 28 determines an amount of a difference between the first potential and the second potential. In the network form recognition operating state the control unit 28 compares the amount of the difference between the first potential and the second potential with a difference reference potential stored in the storage unit of the control unit 28. In the present exemplary embodiment the difference reference potential is essentially 30 mV.

If the amount of the difference between the first potential and the second potential is greater than the difference reference potential stored in the storage unit of the control unit, in the network form recognition operating state the control unit 28 concludes that a zero conductor is present at one of the supply connections 18, 20. In the network form recognition operating state the control unit 28 recognizes a presence of a zero conductor at one of the supply connections 18, 20 from the potentials present at the measuring input 26. If a zero conductor is present at one of the supply connections 18, 20, the first potential and the second potential differ significantly from one another.

Zero conductor and phase conductor are transposed depending on the insertion direction of an appliance plug in a socket of the supply network. As the potential present at the measuring input 26 changes as a function of a polarity present at the heating element 12, unambiguous polarity should be ascertained for exact detection of the leakage current from the heating element 12 in the heating operating state.

If the control unit 28 recognizes a presence of a zero conductor at one of the supply connections 18, 20, the control unit 28 starts a polarity detection operating state in a polarity detection step 90. In the polarity detection operating state the control unit 28 determines the supply connection 18, 20 at which the zero conductor is present.

In the polarity detection operating state the control unit 28 compares the first potential with a lower reference potential stored in the storage unit of the control unit 28. In the polarity detection operating state, if the first potential is smaller than the lower reference potential, the control unit 28 recognizes a presence of a zero conductor at the first heating connection 14. In the polarity detection operating state, if the first potential is smaller than the lower reference potential, the control unit 28 recognizes a presence of a phase conductor at the second heating connection 16. In the present exemplary embodiment the lower reference potential is essentially 30 mV.

In the network form recognition operating state in the polarity detection step 90 the control unit 28 determines a trip limit value for the heating element 12 from the determined network form. In the network form recognition operating state the control unit 28 takes a trip limit value assigned to the determined network form from the storage unit of the control unit 28. If a zero conductor is present at the first heating connection 14, the determined trip limit value for the heating element 12 in the present exemplary embodiment is essentially 600 mV.

In the polarity detection operating state the control unit 28 compares the first potential with an upper reference potential stored in the storage unit of the control unit 28. In the polarity detection operating state, if the first potential is greater than the upper reference potential, the control unit 28 recognizes a presence of a phase conductor at the first heating connection 14. In the polarity detection operating state, if the first potential is greater than the upper reference potential, the control unit 28 recognizes a presence of a zero conductor at the second heating connection 16. In the present exemplary embodiment the upper reference potential is essentially 500 mV.

In the network form recognition operating state in the polarity detection step 90 the control unit 28 determines a trip limit value for the heating element 12 from the determined network form. In the network form recognition operating state the control unit 28 takes a trip limit value assigned to the determined network form from the storage unit of the control unit 28. If a zero conductor is present at the second heating connection 16, the determined trip limit value for the heating element 12 in the present exemplary embodiment is essentially 1200 mV.

If the amount of the difference between the first potential and the second potential is smaller than the difference reference potential stored in the storage unit of the control unit 28, the control unit 28 concludes an absence of a zero conductor at the supply connections 18, 20.

If the amount of the difference between the first potential and the second potential is smaller than the difference reference potential stored in the storage unit of the control unit 28, in a second verification step 92 in the network form recognition operating state the control unit 28 verifies the validity of the first potential and the second potential. In the network form recognition operating state the control unit 28 compares the first potential and the second potential respectively with a validity range stored in the storage unit of the control unit 28.

If the first potential and the second potential each lie within the validity range, in the network form recognition operating state in a conclusion step 94 the control unit 28 recognizes a presence of phase conductors at the supply connections 18, 20 from the potentials present at the measuring input 26. In the present exemplary embodiment the validity range is essentially from 300 mV to 420 mV. The validity range is relevant for the presence of phase conductors at the supply connections 18, 20. The validity range is not relevant for the presence of a zero conductor at one of the supply connections 18, 20. If phase conductors are present at the supply connections 18, 20, the first potential and the second potential only differ slightly from one another.

In the network form recognition operating state in the conclusion step 94 the control unit 28 determines a trip limit value for the heating element 12 from the determined network form. In the network form recognition operating state the control unit 28 takes a trip limit value assigned to the determined network form from the storage unit of the control unit 28. If phase conductors are present at the supply connections 18, 20, the determined trip limit value for the heating element 12 in the present exemplary embodiment is essentially 900 mV.

If at least one of the potentials is outside the validity range, in the network form recognition operating state the control unit 28 does not use the potentials when recognizing a presence of phase conductors at the supply connections 18, 20. In the network form recognition operating state, if at least one of the potentials is outside the validity range, the control unit 28 recognizes an appliance defect from the potentials present at the measuring input in an error recognition step 96.

If at least one of the potentials is outside the validity range, in the error recognition step 96 the control unit 28 outputs a warning in particular to an operator by way of the display unit of the operating unit 46. The control unit 28 then recognizes the presence of a hardware error, which could be caused for example by the heating element 12 and/or by one of the switching elements 22, 48, and/or the presence of a software error.

The heating element 12 and sensor element 30 together form a capacitor (see FIG. 2). In a fitted state the sensor element 30 and heating element 12 are arranged adjacent to one another. The heating element 12 and sensor element 30 are each configured as a layer. The domestic appliance heating apparatus 10 has a base element 78, to which the heating element 12 and the sensor element 30 are applied in the fitted state. The base element 78 is grounded (see FIG. 3).

The domestic appliance heating apparatus 10 has a dielectric 32, which is arranged between the heating element 12 and the sensor element 30 (see FIG. 2). The dielectric 32 has a temperature-dependent specific resistance. The temperature-dependent specific resistance of the dielectric 32 only changes slightly below a threshold value. When the heating element 12 is at a temperature below the threshold value, as for example in the network form recognition operating state and/or in the polarity detection operating state, the dielectric 32 at least essentially blocks a current flow between the heating element 12 and the sensor element 30. The temperature-dependent specific resistance of the dielectric 32 decreases as the temperature increases at temperatures above the threshold value. An amount of the threshold value is selected in a region where the heating element 12 starts to overheat. In the present exemplary embodiment the threshold value is essentially 300° C.

The sensor element 30 and base element 78 together form a capacitor. The domestic appliance heating apparatus 10 has a further dielectric 80, which is arranged between the sensor element 30 and the base element 78. The further dielectric 80 has an essentially temperature-independent specific resistance, which only changes to an insignificant degree as the temperature increases. Independently of operating state the further dielectric 80 at least essentially blocks a current flow between the sensor element 30 and the base element 78.

When an operator presets a heating output for the heating element 12 by means of the operating unit 46, the control unit 28 starts the heating operating state. To start the heating operating state, the control unit 28 closes the switching element 22 and the second switching element 48 (see FIG. 4). When the heating element 12 is at a temperature below the threshold value, the dielectric 32 at least essentially prevents a leakage current from the heating element 12 by means of the specific resistance of the dielectric 32.

When the heating element 12 is at a temperature above the threshold value, a leakage current that is essentially different from zero leaves the heating element 12. The leakage current from the heating element 12 has different values depending on the temperature of the heating element 12. The leakage current from the heating element 12 has higher values for higher temperatures of the heating element 12.

In the heating operating state the control unit 28 determines a characteristic variable that is a function of the leakage current from the heating element 12. The characteristic variable comprises a temperature of the heating element 12. In the heating operating state the control unit 28 uses the characteristic variable to verify whether there is overheating of the heating element 12. In the heating operating state the control unit 28 uses the temperature-dependent specific resistance of the dielectric 32 to determine the characteristic variable. An expected value of the leakage current as a function of a temperature of the heating element 12 is stored in the storage unit of the control unit 28. In the heating operating state the control unit 28 compares the determined value of the leakage current, determined by the control unit 28 from the potential present at the measuring input 26, with the leakage current values stored in the storage unit. The control unit 28 determines the characteristic variable from this in the heating operating state.

When determining the characteristic variable that is a function of the leakage current from the heating element 12, in the heating operating state the control unit 28 takes into account the network form present at the heating element 12. In the heating operating state the control unit 28 selects different trip limit values stored in the storage unit of the control unit 28 as a function of a network form present at the heating element 12 for comparison with the value of the potential present at the measuring input 26 transmitted to the control unit 28 by the measuring unit 24.

If the leakage current from the heating element 12 has a value above the trip limit value stored in the storage unit and determined by the control unit 28, in the heating operating state the control unit 28 deactivates the heating element 12, in particular by opening the switching element 22 and/or the second switching element 48. Alternatively or additionally in the heating operating state the control unit 28 outputs a warning in particular to an operator, if the leakage current from the heating element 12 has a value above the trip limit value stored in the storage unit and determined by the control unit 28.

In the heating operating state a value of the potential present at the measuring input 26 is a function of a heated surface of the heating element 12. The potential present at the measuring input 26 has different values in the heating operating state depending on the number of activated circuits of the heating element 12. In the heating operating state the control unit 28 recognizes a number of activated heating circuits of the heating element 12 by means of the potential present at the measuring input 26. In the heating operating state the control unit 28 recognizes defective heating circuits of the heating element 12 from the potential present at the measuring input 26. If one and/or more heating circuits of the heating element 12 is/are defective, in the heating operating state the control unit 28 outputs a warning in particular to an operator by way of the display unit and/or deactivates the heating element 12, in particular by opening the first switching element 22 and/or the second switching element 48.

If the heating element 12 is used to heat water, limescale can be deposited on the heating element 12. Limescale on the heating element 12 has an insulating effect and in the heating operating state reduces the maximum transfer of heat from the heating element 12 to items being cooked that are to be heated by the heating element 12, for example water. In the heating operating state limescale on the heating element 12 increases the temperature of the heating element 12. In extreme instances the heating element 12 could overheat and be damaged in particular by limescale on the heating element 12.

In the heating operating state a value of the potential present at the measuring input 26 is a function of a degree of soiling of the heating element 12. Soiling could be in the form of calcification for example. The potential present at the measuring input 26 has different values in the heating operating state depending on the degree of soiling. In the heating operating state the control unit 28 recognizes soiling of the heating element 12 by means of the potential present at the measuring input 26. In the heating operating state the control unit 28 outputs information about soiling of the heating element 12 in particular to an operator by means of the display unit. Alternatively or additionally in the heating operating state the control unit 28 deactivates the heating element 12, in particular by opening the first switching element 22 and/or the second switching element 48.

This allows emergency operation of the heating element 12 to be achieved, in particular in the event of one and/or more defective heating circuits of the heating element 12 and/or in the event of soiling of the heating element 12. Also, if the heating element 12 overheats, measures can be instituted to protect against overheating of the heating element 12, in particular by means of actions performed by the control unit 28.

Alternatively the base element could be dispensed with. Configurations with different numbers of heating elements and/or sensor elements are also possible.

The invention claimed is:

1. A domestic appliance heating apparatus, comprising:
    a heating element including at least two heating connections, one of the at least two heating connections configured for connection to one of at least two supply connections of a supply network and another one of the at least two heating connections configured for connection to another one of the at least two supply connections of the supply network;
    a first switching element connected between the one of the at least two heating connections and the one of the at least two supply connections;
    a second switching element connected between the other one of the at least two heating connections and the other one of the at least two supply connections;
    a measuring unit having at least one measuring input, at which a potential is present in at least one heating operating state; and
    a control unit configured to interrupt in a network form recognition operating state a conduction path through the heating element by means of the first switching element while the second switching element is closed and to take into account a first potential present at the measuring input when determining a network form present at the heating element.

2. The domestic appliance heating apparatus of claim 1, wherein the control unit is configured to interrupt a conduction path through the heating element by means of the second switching element while the first switching element is closed in the network form recognition operating state and to take into account a second potential present at the measuring input when determining the network form present at the heating element.

3. The domestic appliance heating apparatus of claim 2, wherein the control unit is configured to recognize a presence of a zero conductor at one of the at least two supply connections from the potentials present at the measuring input in the network form recognition operating state.

4. The domestic appliance heating apparatus of claim 3, wherein the control unit is configured to determine the one of the at least two supply connections at which the zero conductor is present in at least one polarity detection operating state.

5. The domestic appliance heating apparatus of claim 2, wherein the control unit is configured to recognize a presence of phase conductors at the supply connections from the potentials present at the measuring input in the network form recognition operating state.

6. The domestic appliance heating apparatus of claim 2, wherein the control unit is configured to recognize at least one appliance defect from the potentials present at the measuring input in the network form recognition operating state.

7. The domestic appliance heating apparatus of claim 1, wherein the control unit is configured to determine a trip limit value for the heating element from the determined network form in the network form recognition operating state.

8. The domestic appliance heating apparatus of claim 1, further comprising a sensor element configured to detect a leakage current from the heating element in the heating operating state.

9. The domestic appliance heating apparatus of claim 8, wherein the control unit is configured to determine a characteristic variable that is a function of the leakage current from the heating element in the heating operating state.

10. The domestic appliance heating apparatus of claim 9, wherein the control unit is configured to take into account the network form present at the heating element when determining the characteristic variable that is a function of the leakage current from the heating element in the heating operating state.

11. A domestic appliance, comprising a domestic appliance heating apparatus, said domestic appliance heating apparatus comprising a heating element including at least two heating connections, one of the at least two heating connections configured for connection to one of at least two supply connections of a supply network and another one of the at least two heating connections configured for connection to another one of the at least two supply connections of the supply network, a first switching element connected between the one of the at least two heating connections and the one of the at least two supply connections, a second switching element connected between the other one of the at least two heating connections and the other one of the at least two supply connections, a measuring unit having at least one measuring input, at which a potential is present in at least one heating operating state, and a control unit configured to interrupt in a network form recognition operating state a conduction path through the heating element by means of the first switching element while the second switching element is closed and to take into account a first potential present at the measuring input when determining a network form present at the heating element.

12. A method for operating a domestic appliance heating apparatus which includes a heating element including at least two heating connections, one of the at least two heating connections configured for connection to one of at least two supply connections of a supply network and another one of the at least two heating connections configured for connection to another one of the at least two supply connections of the supply network, a first switching element connected between the one of the at least two heating connections and the one of the at least two supply connections, a second switching element connected between the other one of the at least two heating connections and the other one of the at least two supply connections, and a measuring unit having at least one measuring input, at which a potential is present in at least one heating operating state, said method comprising:

interrupting a conduction path through the heating element by means of the first switching element while the second switching element closed in at least one network form recognition operating state; and taking into account a first potential present at the measuring input when determining a network form present at the heating element.

13. The method of claim 12, further comprising interrupting a conduction path through the heating element by means of the second switching element while the first switching element is closed in the network form recognition operating state and to take into account a second potential present at the measuring input when determining the network form present at the heating element.

14. The method of claim 13, further comprising recognizing a presence of a zero conductor at one of the at least two supply connections from the potentials present at the measuring input in the network form recognition operating state.

15. The method of claim 14, further comprising determining the one of the at least two supply connections at which the zero conductor is present in at least one polarity detection operating state.

16. The method of claim 13, further comprising recognizing a presence of phase conductors at the supply connections from the potentials present at the measuring input in the network form recognition operating state.

17. The method of claim 13, further comprising recognizing at least one appliance defect from the potentials present at the measuring input in the network form recognition operating state.

18. The method of claim 12, further comprising determining a trip limit value for the heating element from the determined network form in the network form recognition operating state.

19. The method of claim 12, further comprising detecting a leakage current from the heating element in the heating operating state.

20. The method of claim 19, further comprising determining a characteristic variable that is a function of the leakage current from the heating element in the heating operating state.

21. The method of claim 20, further comprising taking into account the network form present at the heating element when determining the characteristic variable that is a function of the leakage current from the heating element in the heating operating state.

* * * * *